United States Patent
Chou et al.

(10) Patent No.: US 6,545,911 B2
(45) Date of Patent: Apr. 8, 2003

(54) FLASH MEMORY ERASE METHOD

(75) Inventors: Ming-Hung Chou, Miaoli Hsien (TW); Hsin-Yi Ho, Hsinchu (TW); Smile Huang, Tainan (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

(21) Appl. No.: 09/930,801

(22) Filed: Aug. 14, 2001

(65) Prior Publication Data

US 2002/0154544 A1 Oct. 24, 2002

(30) Foreign Application Priority Data

Apr. 20, 2001 (TW) ...................................... 90109498 U

(51) Int. Cl.[7] ................................................ G11C 16/04
(52) U.S. Cl. .............................. 365/185.18; 365/185.3; 365/185.26
(58) Field of Search ........................ 365/185.22, 185.33, 365/185.18, 185.3, 185.26, 218

(56) References Cited

U.S. PATENT DOCUMENTS

| | | | | |
|---|---|---|---|---|
| 5,357,476 A | * | 10/1994 | Kuo et al. ............. | 365/185.12 |
| 5,901,090 A | * | 5/1999 | Haddad et al. ........ | 365/185.29 |
| 6,091,642 A | * | 7/2000 | Pasotti et al. .......... | 365/185.24 |
| 6,188,609 B1 | * | 2/2001 | Sunkawavalli et al. | 365/185.22 |

* cited by examiner

Primary Examiner—David Nelms
Assistant Examiner—Thong Le
(74) Attorney, Agent, or Firm—J. C. Patents

(57) ABSTRACT

An flash memory erase method. A bias $V_g$ is applied to a gate of a memory cell. A bias $V_d$ is applied to a source/drain region of the memory cell to execute an erase operation. The bias $V_d$ is increased from an initial value to a predetermined value over time. During the increase of the bias $V_d$, no inspection is performed. Whether the memory of each memory cell has been erased is inspected. If the erase operation is complete, the erase operation is over. If not, a voltage raise erase-inspection step is performed at least once until it is confirmed that the memory of all the memory cells has been erase. Each voltage raise erase-inspection step includes an erase step with a raised voltage and an inspection step afterwards.

17 Claims, 2 Drawing Sheets

FLASH MEMORY ERASE METHOD

CROSS-REFERENCE TO RELATED APPLICATION

This application claims the priority benefit of Taiwan application serial no. 90109498, filed Apr. 20, 2001.

BACKGROUND OF THE INVENTION

1. Field of the Invention

The invention relates in general to an operation of a memory device, and more particularly, to a flash memory erase method.

2. Description of the Related Art

The flash memory is the most common non-volatile memory (NVM) and has a high device integration and an erase rate much higher than other kinds of non-volatile memories. In many flash memories, an erase operation is performed by applying a negative bias $V_g$ to the gate of the memory cells thereof, and a positive bias $V_d$ to the source/drain region. The difference between the biases $V_g$ and $V_d$ has to be sufficiently large to cause a tunneling effect such that the electron in the gate can tunnel to the substrate.

Due to the difference of process condition, the bias $V_d$ required to erase the memory of each memory cell has a distribution range. The distribution range basically covers the erase voltage for most of the memories. Although a single value of $V_d$ equal to or over the maximum of the distribution range can erase the memories of most memory cells, it is easy to damage the memory cells thereby. Therefore, the conventional erase method of the flash memory uses a step-by-step manner to increase the bias $V_d$ applied to the source/drain region. After the end of each step, an inspection operation is performed until it is confirmed that all the memories of the memory cells have been erased.

The above method insures that the memory of all the memory cells has been erased. However, an inspection step is required each time after raising the bias $V_d$. As 10 Kbit or 100 Kbit is used as an inspection unit for the inspection operation, a very long time is consumed. Thus, the erase operation time cannot be shortened.

SUMMARY OF THE INVENTION

The invention provides a flash memory erase method. A bias $V_g$ is applied to a gate of a memory cell, and a bias $V_d$ is applied to a source/drain region of the memory cell to perform an erase operation. The bias $V_d$ gradually increases from an initial value to a predetermined value. While increasing the bias $V_g$, no inspection step is performed. The memory cells are inspected to determine whether the memory thereof has been entirely erased. If yes, the erase operation is complete. If not, a voltage raise erase-inspection step is performed at least once until the memory of all the memory cells has been erased. The ith voltage raise erase-inspection step includes a voltage raise erase step for a time period T(i) and an inspection step afterwards. The bias $V_d$ for the first voltage raise erase step is higher than the predetermined value. When i>1, the bias $V_d$ of the ith voltage raise erase step is higher than that of the (i−1)th voltage raise erase step.

As mentioned above, in the flash memory erase method in the invention, while increasing the initial value of the bias $V_d$ applied to the source/drain region to the predetermined value, no inspection step is required. The overall operation time for the erase operation is thus greatly reduced.

Both the foregoing general description and the following detailed description are exemplary and explanatory only and are not restrictive of the invention, as claimed.

DESCRIPTION OF THE PREFERRED EMBODIMENTS

Figure 1:
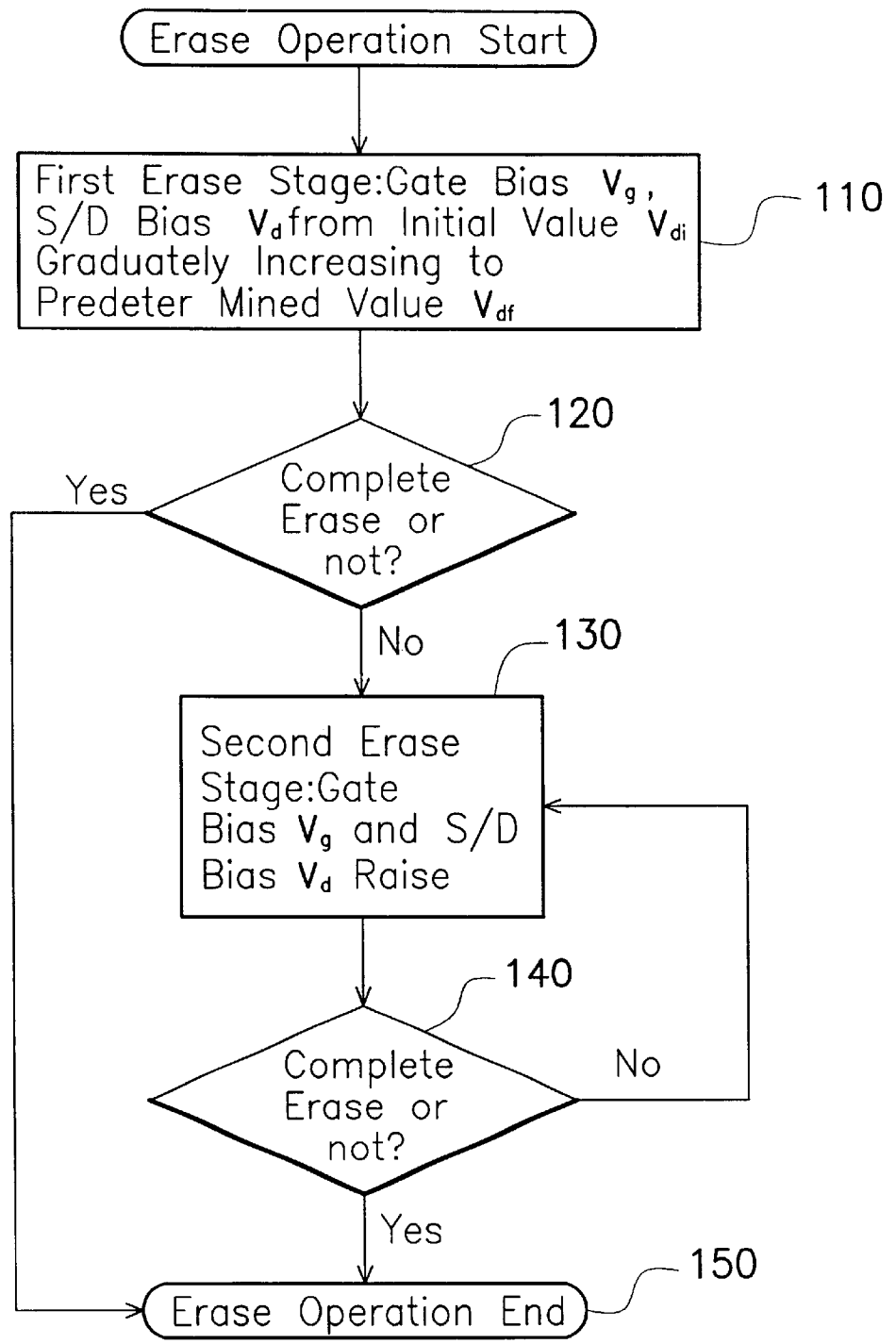
FIG. 1 is a flow chart showing an flash memory erase method according to the invention.

FIG. 1 is a flow chart showing an erase method for a flash memory according to the invention. As shown as the step 110 in FIG. 1, a bias $V_g$ and a bias $V_d$ are applied to a gate and a source/drain region of a memory cell, respectively. The bias $V_d$ gradually increases from an initial value $V_{di}$ to a predetermined value $V_{df}$. While increasing the bias $V_d$, no inspection step is performed. The step 120 is performed to inspect whether the memory of all the memory cells has been erased. If the answer is yes, the erase operation is complete (step 150). If not, at least one voltage raise erase-inspection step is performed (the loop constituted by steps 130 and 140). The voltage raise erase-inspection step is performed reiteratively until the memory of all the memory cells has been erased. For each voltage raise erase-inspection step, the bias $V_d$ is raised with an increment first, and an inspection step is performed to determined whether the memory of all the memory cells has been erased.

Figure 2:
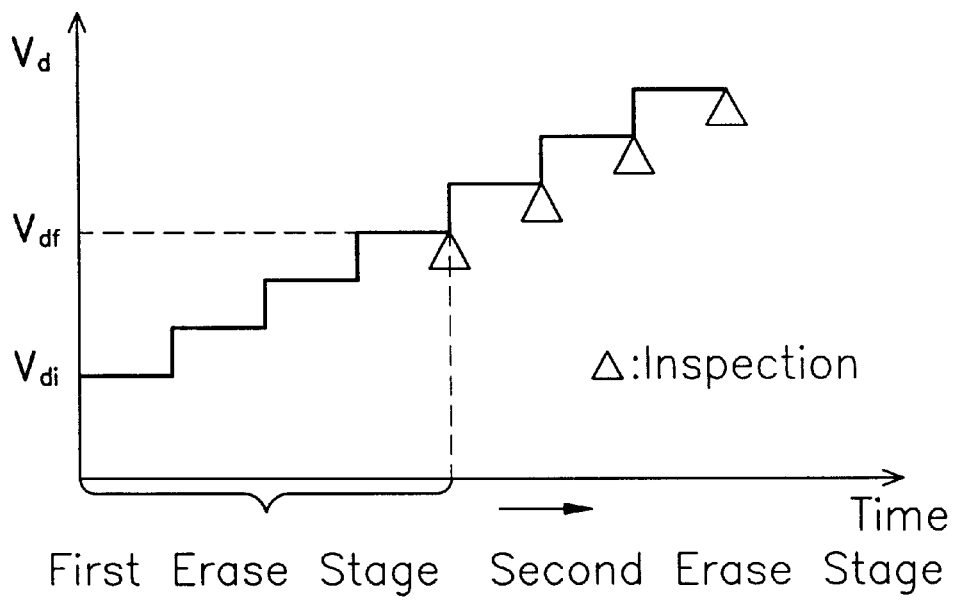
FIG. 2 the variation of the bias $V_d$ applied to the source/drain region as a function of time, and the notation "Δ" is used to indicate the time for inspecting the erase status.

FIG. 2 shows the variation of the source/drain bias $V_d$ versus time in the flash memory erase method according to the invention. "Δ" is used to mark the time at which the erase status is inspected. As shown in FIG. 2, in the first erase stage, the source/drain bias $V_d$ starts from the initial value $V_{di}$ and gradually increases to the predetermined value $V_{df}$ step-by-step. There are four stages from the initial value $V_{di}$ to the predetermined value $V_{df}$. In the first stage, the source/drain bias voltage $V_d$ is $V_{di}$. In the fourth stage, the source/drain bias voltage $V_d$ is $V_{df}$. The difference between each pair of neighbouring stages is about the same. The duration of each stage is about the same, for example, 30 ms. For a typical flash memory, when the bias $V_g$ is −3V, the source/drain bias $V_d$ from first to fourth stages can be 4.4V, 5.2V, 6.0V and 6.8V. However, the number of stages between the initial value $V_{di}$ to $V_{df}$ is not restricted to 4, and the difference in $V_{di}$ between each pair of two neighbouring stages does not have to be the same. That is, $V_d$ does not have to be an arithmetical series. The time period for each stage is also irrelevant to others.

Figure 3:
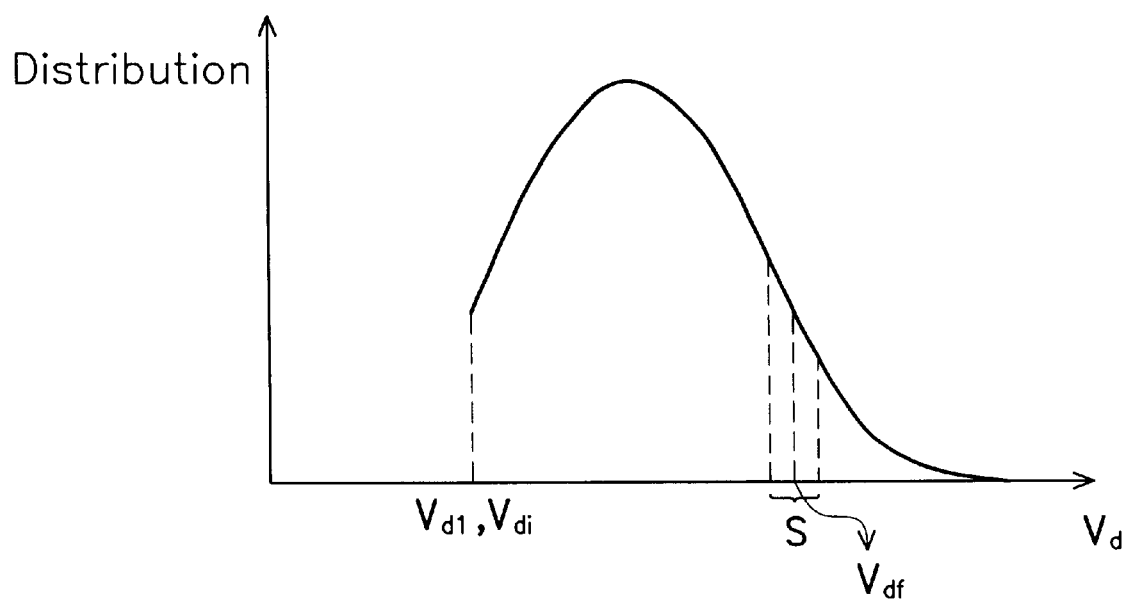
FIG. 3 shows the distribution of the bias $V_d$ required for erasing the memory of each memory cell, and the optimum set up for the initial value $V_{di}$ and the predetermined value $V_{df}$ of the bias.

Referring to FIG. 2, at the second erase stage after the first inspection step, the source/drain bias $V_d$ still gradually increases. The difference is that an inspection step is performed after each erase stage until the memory of all the memory cells has been erased. In FIG. 3, three voltage raise erase-inspection steps are performed. The duration of each voltage raise erase-inspection step is about the same, for example, 30 ms. The difference in $V_d$ between each pair of two neighbouring voltage raise erase-inspection steps is about the same. That is, source/drain bias $V_d$ is an arithmetical series. For a typical flash memory, when the gate bias $V_g$ is about −3V, and the predetermined source/drain bias value $V_{df}$ is about 6.8V, $V_d$ in the first to the third voltage raise erase stage is 7.6V, 8.4V and 9.2V, respectively. Again, the number of the voltage raise erase-inspection steps is not limited to 3, and the difference in $V_d$ does not have to be a fixed value. The time period for each stage can be different according to specific requirements.

The above initial value $V_{di}$ and predetermined value $V_{df}$ are determined according to specific bias $V_d$ for erasing the memory of each memory cell. Referring to FIG. 3, a distribution of source/drain bias $V_d$ under the circumstance that $V_g$ is fixed is shown. As shown in FIG. 3, the distribution curve is not 0 only over a specific value $V_{dt}$. With a larger $V_d$, a steep section S has a large absolute value of slope. The voltage $V_d$ to erase the memory of most of the memory cells falls before the steep section S. Therefore, the above mentioned optimum value $V_{dl}$ of the initial value $V_{di}$ falls before the section S, while the predetermined value $V_{df}$ falls within the section S to reduce the number and time of inspection steps.

As mentioned above, in the erase method of flash memory provided by the invention, while increasing the source/drain bias $V_d$ from the initial value $V_{di}$ to the predetermined value $V_{df}$, no inspection is executed, so that the overall operation time for erase is greatly reduced. Furthermore, the predetermined value $V_{df}$ is set at the steep section S of the distribution curve, so that the number and time consumed for inspection is shortened.

In addition, the gate bias $V_g$ of the erase method is not restricted to fixing the gate bias $V_g$ and varying the source/drain bias $V_d$. It is appreciated that the source/drain bias $V_d$ can be fixed and the gate bias $V_g$ varied to achieve the same goal of the invention without exceeding the spirit and scope of the invention. The principle is that as long as $V_g V_d (\equiv \Delta)$ is sufficiently large, an erase operation can be executed. The value of $\Delta$ can also be increased gradually versus time.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claimed is:

1. A flash memory erase method that comprises a plurality of memory cells, the method comprising:
   performing a first erase step, which includes applying a bias $V_g$ to a plurality of gates of the memory cells, a bias $V_d$ to a plurality of source/drain regions of the memory cells, wherein the bias $V_d$ is gradually increased from an initial value to a predetermined value, and no inspection step is performed while increasing the bias $V_d$; and
   inspecting whether memory of all the memory cells is erased, and performing a second erase step when the answer is no, wherein the second erase step includes at least one voltage raise erase-inspection step to insure that memory of all the memory cells has been erased; wherein
   an ith voltage raise erase-inspection with a duration T(i) includes a voltage raise erase step and an inspection step afterwards, and the first voltage raise erase step has a value of $V_d$ larger than the predetermined value of $V_d$, and when i>1, a value of the $V_d$ at the ith voltage raise erase-inspection step is higher than that of the (i−1)th voltage raise erase-inspection step, wherein bias $V_d$ can be divided into m stages from the initial value to the predetermined value, wherein the value $V_d(j)$ of $V_d$ at the jth stage is larger than $V_d(j−1)$ at the (j−1)th stage.

2. The method according to claim 1, wherein the bias $V_d$ is an arithmetical series.

3. The method according to claim 1, wherein m=4.

4. The method according to claim 3, wherein each stage lasts for about 30 ms.

5. The method according to claim 3, wherein when m=4 and $V_g$ is −3V, $V_d(j=1)$ to $V_d(j=4)$ is 4.4V, 5.2V, 6.0V and 6.8V, respectively.

6. The method according to claim 1, wherein the bias $V_d$ of the ith voltage raise erase-inspection step is a fixed value $V_d(i)$, wherein $V_d(i=1)$ and is larger than the predetermined value, and $V_d(i, i>1)$ is larger than $V_d(i−1)$.

7. The method according to claim 6, wherein $V_d$ is an arithmetical series.

8. The method according to claim 1, wherein when the bias $V_g$ is −3V and the predetermined value is 6.8V, $V_d(i=1)$ to $V_d(i=3)$ is 7.6V, 8.4V and 9.2V, respectively.

9. The method according to claim 1, wherein T(i) is about 30 ms.

10. The method according to claim 1, wherein the bias $V_d$ includes a distribution curve, of which there is a steep section with a maximum absolute value of slope after a top of the distribution curve, and the predetermined value falls within the steep section.

11. A flash memory erase method, wherein the flash memory comprises a plurality of memory cells, the method comprising:
    performing a first erase step to allow a potential difference $\Delta V$ between a gate and a source/drain region of each of the memory cells, wherein the potential difference $\Delta V$ starts from an initial value and gradually increases up to a predetermined value, and while increasing the potential difference $\Delta V$, no inspection step is performed;
    inspecting whether memory of all the memory cells has been erased, and performing a second erase step if the memory of any of the memory cells is not erased, wherein the second erase step comprises i episodes of voltage raise erase-inspection steps to insure the memory of all the memory cells has been erased, and i≧1; wherein
    the ith voltage raise erase-inspection step comprises a voltage raise erase step lasting for a time period T(i) and an inspection step afterwards, the first voltage raise erase step has the potential difference $\Delta V$ higher than the predetermined value, and when i>1, the $\Delta V$ is higher than that of the voltage raise erase step for i−1, wherein the potential difference $\Delta V$ from the initial value to the predetermined value can be divided into m stages, wherein a jth stage has a potential difference of a fixed value $\Delta V(i)$, and $\Delta V(i, J>1)$ is larger than $\Delta V(j−1)$.

12. The method according to claim 11, wherein $\Delta V(j=1)$ to $\Delta V(j=m)$ includes an arithmetical series.

13. The method according to claim 11, wherein m is 4.

14. The method according to claim 13, wherein a duration of each of the m stages is 30 ms.

15. The method according to claim 11, wherein the potential difference $\Delta V$ at the ith voltage raise erase step is a fixed value $\Delta V(i)$, and $\Delta V(i, i>1)$ is larger than $\Delta V(i−1)$.

16. The method according to claim 15, wherein $\Delta V(i)$ includes an arithmetical series.

17. The method according to claim 11, wherein T(i) is 30 ms.

* * * * *